United States Patent
Shi et al.

(10) Patent No.: US 6,262,539 B1
(45) Date of Patent: Jul. 17, 2001

(54) CATHODE ARC SOURCE WITH TARGET FEEDING APPARATUS

(75) Inventors: Xu Shi; Beng Kang Tay, both of Singapore (SG); Hong Siang Tan, Selangor (MY)

(73) Assignee: Filplas Vacuum Technology PTE Ltd, Singapore (SG)

( * ) Notice: Subject to any disclaimer, the term of this patent is extended or adjusted under 35 U.S.C. 154(b) by 0 days.

(21) Appl. No.: 09/529,976

(22) PCT Filed: Oct. 26, 1998

(86) PCT No.: PCT/IB98/01768

§ 371 Date: Oct. 13, 2000

§ 102(e) Date: Oct. 13, 2000

(87) PCT Pub. No.: WO99/22398

PCT Pub. Date: May 6, 1999

(30) Foreign Application Priority Data

Oct. 24, 1997 (GB) .................................................. 9722650

(51) Int. Cl.$^7$ ......................................................... H01J 7/24
(52) U.S. Cl. ................................. 315/111.81; 315/111.71; 204/298.12; 204/298.15; 204/192.38
(58) Field of Search ........................ 315/111.81, 111.71, 315/111.21–111.41; 204/297 W, 298.12, 298.15, 298.41, 192.38

(56) References Cited

U.S. PATENT DOCUMENTS

| 5,269,896 | * | 12/1993 | Munemasa et al. | ............ 204/192.38 |
| 5,282,944 | * | 2/1994 | Sanders et al. | ................. 204/192.38 |
| 5,317,235 | * | 5/1994 | Treglio | .............................. 315/111.41 |
| 5,441,624 | * | 8/1995 | Chan et al. | ...................... 204/298.41 |
| 5,895,559 | * | 4/1999 | Christy | ............................. 204/192.38 |

FOREIGN PATENT DOCUMENTS

| 195 09 440 A1 | 9/1995 | (DE) . |
| 0 516 425 | 12/1992 | (EP) . |
| WO 96/26531 | 8/1996 | (WO) . |
| WO 98/03988 | 1/1998 | (WO) . |

OTHER PUBLICATIONS

European Patent Office, Patent Abstracts of Japan; Publication No. 60047357; Publication Date Mar. 14, 1985.
International Search Report of International Application No. PCT/IB98/01768, mailed May 11, 1999.

* cited by examiner

Primary Examiner—Haissa Philogene
(74) Attorney, Agent, or Firm—Sterne, Kessler, Goldstein & Fox p.l.l.c.

(57) ABSTRACT

Apparatus for feeding a target into a chamber of a cathode arc source comprises support structure (22, 23, 24) attached to or integral with the cathode arc source (10), a cathode station (16, 17, 18) for receiving a target (18) in electrical connection with an arc power supply, wherein the cathode station is mounted for movement (21, 37) on the support structure relative to the chamber so as to feed the target into the chamber. The apparatus can also have a target cutter in the chamber for removing an upper portion of the target. A graphite target for feeding into the source is a composite of at least inner and outer sections, the inner section comprising graphite powder and having a density in the range 1.7–2.0 g/cm$^3$ and the outer section comprising graphite powder and having a density that is at least 0.1 g/cm$^3$ less than that of the inner section.

28 Claims, 3 Drawing Sheets

CATHODE ARC SOURCE WITH TARGET FEEDING APPARATUS

BACKGROUND OF THE INVENTION

The present invention relates to a cathode arc source, in particular to a cathode arc source adapted for industrial or long term operation.

Cathode arc deposition of tetrahedral amorphous carbon, metallic, dielectric and other such coatings is known in the art and offers the potential for deposition of thin films of high quality. Applications in scratch resistant optical coatings and hard disc media coatings are but two of a wide range of proposed uses.

Hitherto, deposition of films by the cathode arc process has been mainly limited to laboratory use, in general because of difficulties in the art in reliably depositing films that are free of or have acceptably low contamination by macroparticles—large, neutral particles.

Provision of improved means for filtering macroparticles from the arc plasma has recently been described in WO-A-96/26531 and also in as yet unpublished International patent application no. PCT/GB97/01992.

Existing filtered cathode arc sources can not yet, however, be continuously used, or used for long periods of time. This renders them unattractive for use in industrial processes. Existing cathode arc sources have to be shut down frequently so as to change or adjust or tidy up the target—this is time-consuming and wastes energy in reestablishment of the vacuum in the chamber and reestablishment of the arc. Whenever an arc is stopped and then restruck, the first plasma discharge from the arc is typically dirty and should preferably not be used for deposition on the substrate. Thus, when the arc is frequently stopped and restarted much operator interaction is required to obtain the best possible coating quality.

In use of known cathode arc sources, it is observed that target erosion is typically uneven, with the cathode spot moving erratically across the target surface. A relatively smooth target surface is preferred for deposition of plasma using a cathode arc source, but the smooth surface is rapidly lost by action of the arc spot.

Shutting down the arc and opening the chamber, including breaking vacuum in the chamber, in order to adjust or clean the target is undesirable for the reasons explained above.

SUMMARY OF THE INVENTION

It is therefore an object of the present invention to provide a cathode arc source that can be used continuously or at least for longer periods of time than prior art sources. A further object of the invention is to provide a cathode arc source that can maintain its cathode target in suitable condition for obtaining plasma therefrom.

Accordingly, a first aspect of the invention provides apparatus for feeding a target into a chamber of a cathode arc source, comprising:

- support structure for attachment to or integration with the cathode arc source;
- a cathode station for receiving a target in electrical connection with an arc power supply, wherein the cathode station is mounted for movement on the support structure; and
- means for movement of the cathode station relative to the chamber so as to feed the target into the chamber.

This apparatus confers the advantage that when coupled with a cathode arc source, operation of the source can be continued for a longer time than hitherto possible—as consumed target can be replaced in situ with target fed into the chamber without breaking vacuum.

The cathode station is conveniently adapted to be mounted in an initial position, distal from the chamber and to receive a target thereon and is further adapted to be advanced in a substantially linear path towards the chamber so as to advance the target into the chamber. It is preferable that movement of the target into the chamber of a cathode arc source can be accurately and finely controlled—the rate of erosion of the target may only be at a very low level—and suitable apparatus can feed the target at very small increments, preferably as little as 0.05 mm or 0.1 mm at a time for a graphite target. Though as will be appreciated, rate of erosion can vary with target material and other increments will be appropriate for targets made of other materials. Apparatus of the invention is suitably adapted for feeding the target into the chamber at a rate of between 0.05 mm per second and 10 mm per second.

In an embodiment of the invention, a pinion is mounted on the cathode station and engages with a rack attached to the chamber or attached to the support structure and wherein action of the pinion on the rack moves the cathode station towards or away from the chamber. The pinion is optionally turned by a handle or lever projecting from the apparatus and accessible to an operator. It is further optional for a ratchet mechanism to be incorporated into the apparatus so that movement of the target into the chamber can be in one direction only until the ratchet is released, for example for replacement of a used target. The arrangement could also be reversed, with the pinion on the chamber or the support structure.

Movement of the cathode station is alternatively achieved via an electric motor, optionally controlled by arc power supply circuitry. Monitoring means associated with the arc power supply may be used to determine the rate of deposition and can be used to trigger advancement of the target into the chamber at an appropriate rate or time.

A sealing member is optionally provided, adapted to provide a seal between the edge of the target and the chamber whilst the target is fed into the chamber, to maintain vacuum in the chamber. A further option is to provide a housing surrounding the cathode station and adapted for sealing engagement with the chamber of the cathode arc source. The housing may be adapted to receive water for cooling of the cathode station or the target or both. The housing may also comprise a feedthrough for an electrical supply to the cathode station, or a feedthrough for a handle that enables manual movement of the cathode station by an external operator.

A particular housing is adapted to be evacuated, such as a vacuum bellows, as described in a specific embodiment of the invention below.

For operation of the cathode arc source there must be electrical connection with the target, either indirectly such as via the cathode station or directly with the target itself. In an embodiment of the invention, power supply to the target is via one or a plurality of electrical brushes with which the target is in electrical engagement whilst being fed into the chamber. As the target moves past the brushes electrical contact is sufficient for an arc to be struck and maintained between the anode and the target. Preferably, a plurality of brushes are provided, located around the target. The target can be circular in cross-section, thus in a particular embodiment of the invention the apparatus comprises a plurality of brushes substantially evenly spaced around the circumference of the target. This arrangement is of advantage in that brushes can maintain electrical contact whilst allowing the target smoothly to be fed into the chamber.

In a second aspect, the invention provides a method of depositing a coating of positive ions on a substrate, by deposition of plasma obtained from an arc between an anode and a cathode target in a vacuum chamber, comprising striking an arc between the anode and the target and feeding the target into the chamber without breaking vacuum in the chamber.

A preferred method according to the invention comprises striking the arc, stopping the arc, feeding the target into the chamber and thereafter restriking the arc. Thus as target material is consumed so an operator can continually introduce fresh target into the chamber and in the correct location for striking of the arc thereon. Advantageously, it thus becomes less frequently necessary to open the chamber to replace a spent or disfigured target.

In another embodiment of the invention the method comprises striking the arc, feeding the target into the chamber and maintaining the arc whilst the target is being fed into the chamber. In this way operation of the cathode arc and deposition of coatings therewith is not periodically stopped and started. As the initial period of deposition following restriking of the arc can give coatings of lower quality, this method of operating the apparatus potentially produces coatings of improved quality, or reduces the operator input required to obtain high quality coatings. Where equipment such as a cathode arc source is likely to be operated by non-skilled workers, any reduction in the need for input by skilled personnel during running is to be desired.

If target is continually fed into the chamber it can be fed into the target into the chamber at a rate between 0.05 mm per second and 10 mm per second, more preferably between 0.2 mm per second and 2 mm per second, depending upon target material and rate of target consumption. The method of the invention can comprise manually feeding the target into the chamber, or controlling the feeding of the target into the chamber by circuitry associated with the cathode arc source. Manual feeding is of use when an operator is setting up the apparatus and placing the target in position to start the arc. Automatic feeding is of use in cases where deposition is monitored and adjustment to the target may be appropriate according to the rate of deposition.

In particularly preferred embodiments of the invention a cathode arc source, for generating plasma from an arc between an anode and a cathode target in a chamber of the source, comprises means in the chamber for removing an upper portion of the target. This is advantageous for cases in which either the target is not consumed in an even manner or if for any other reason it is desired to adjust the surface of the target, such as to smooth the surface. As the target is fed into the chamber portions not consumed may project too far into the chamber, thus this embodiment of the invention enables these to be removed. As it is preferred for the target surface to be smooth, and typical operation of a source results in pits and craters and other marks in the target surface, the facility now to cut away portions of the surface to improve its smoothness is particularly valuable.

A typical source of the invention comprises a target cutter for cutting off an upper portion of the target. Preferably the cutter is adapted to cut cleanly across the top of the target leaving a relatively smooth surface on which to strike an arc. During long term use of a source, this embodiment enables the target surface to be kept in a suitable form without the need for recurrent target changing or adjustment demanding opening of the vacuum chamber.

The target cutter can be composed of any suitable cutting apparatus. One such cutter is a knife mounted for rotational or sliding movement across the target and adapted to cut a graphite target. A saw blade may also be used. The target cutter may comprise a rotating cutting wheel mounted on support structure adapted to move the rotating cutting wheel across the target. In use the target is advanced into the chamber by a small amount. Due to uneven erosion of the target there may be portions of the target the stick out from the target surface, which are to be removed by the target cutter so as to smoothen the surface. A preferred cutter cuts increments of 0.1 mm up to 10 mm, more preferably 0.1 up to 1 mm, from the surface of the target to achieve this.

A particular embodiment of the invention comprises a target cutter mounted on a wall of the source, and adapted to cut off an upper portion of the target and urge that cut upper portion away from the target. This cutter thus also removes the cut portion from the target to avoid it interfering with the arc.

In particularly preferred embodiments of the invention there is also provided a method of depositing a coating of positive ions on a substrate, by deposition of plasma obtained from an arc between an anode and a cathode target in a vacuum chamber, comprising striking an arc between the anode and the target and feeding the target into the chamber without breaking vacuum in the chamber, further comprising removing an upper portion of the target without breaking vacuum in the chamber.

A typical method of the invention comprises feeding the target into the chamber and cutting away a portion of the target or portions of the target that project beyond a predetermined level in the chamber. In a specific embodiment of the invention the method comprises cutting an upper portion of the target using a rotating or slicing cutter mounted on the wall of the chamber and moveable between a position retracted away from the target and a position in which it can cut the target.

A further problem, now encountered using the target cutter of the invention, is build up of debris within the chamber of the cathode arc source. Accordingly, a preferred source of the invention is one further comprising an exit port located at or near the base of the chamber wherein the means for removing an upper portion of the target further comprises means for urging the cut or otherwise removed upper portion towards the exit port. Thus debris from cutting of the target can conveniently be removed from the chamber via the exit port. In a specific embodiment of the invention described in an example below, the exit port is adapted for connection to a vacuum cleaner for vacuum removal of the debris.

Existing targets, for use in cathode arc sources, are single pieces of graphite material, typically prepared by pressing graphite powder, and sometimes by pressing a mixture of graphite powder and a hydrocarbon bonding material, such as tar, at elevated temperature and pressure. These targets can be rather brittle and liable to fracture easily. Any damage such as a crack or a fracture is particularly undesirable when these targets are used in cathode arc sources. A problem now encountered when feeding the target according to the first aspect of the invention is that, in some instances, the target is liable to fracture or otherwise become damaged by the feeding process.

As mentioned above, cathode arc spots move about rapidly on the target surface, and risk migrating towards and possibly over the side of the target.

Accordingly, a third aspect of the invention provides a graphite target for use in a cathode arc source, comprising a composite of at least inner and outer sections, said inner section comprising graphite powder and having a density in the range 1.7–2.0 $g/cm^3$ and said outer section comprising graphite powder and having a density that is at least 0.1 g/cm³ less than that of the inner section.

Preferably, the density of the outer section is at least 0.2 g/cm³ less than that of the inner section.

It is advantageously found that when targets of the invention are used in a cathode arc source an arc spot can move around less rapidly when on the outer section of the target. Thus the spot is less likely to approach too close to or even over the side of the target.

Further, it is advantageously found that when targets of the invention are used in combination with a target feeder according to the first aspect of the invention, the outer section of the target is softer than the inner and can slide easily against the electrical contacts such as brushes or an electrical collar. A favourable result is that the target can more easily be fed into the chamber. Another favourable result is that there is reduced risk of damage to the inner section of the target.

The typical density of the inner section is in the range 1.7–2.0 g/cm³, and of the outer section 1.5–1.9 g/cm³. Preferably, the density of the inner section of the target is in the range 1.8–1.95 g/cm³.

A target of the invention is obtainable by pressing graphite powder of average size greater than 2 microns at elevated temperature and pressure so as to obtain the inner section and thereafter pressing graphite powder around said inner section so as to form an outer section that surrounds the inner section. In a preferred embodiment, a target is obtainable by pressing graphite powder around the inner section at temperature and pressure lower than those used for formation of the inner section. The outer section can be pressed at a temperature at least 20° C., preferably at least 40° C. less than used for pressing of the inner section.

The inner section of the graphite target of the invention is typically made using graphite having average particle size of about 5–20 microns, by pressing the graphite powder at 400–620 MPa at least 150° C., preferably at 230° C.+/−30° C. Preferably, the powder is pressed at 450–600 MPa, most preferably at 500–600 MPa. The graphite powder is pressed in the substantial absence of binding material so that the resultant target has a porous structure that traps gas within its pores or cells. When used in conventional cathode arc sources, a plasma beam of positive ions is obtainable with reduced emission of contaminating macroparticles. This property is believed to be due to release of small amounts of gas from within the pores of the target into the arc, which gas aids ionisation in the arc spot. The inventors do not, however, wish to be bound by this theory. For coating applications in which a small amount of gas in the film can be tolerated, the target is thus of advantage as it reduces macroparticles in the film.

In a particular embodiment of the invention, the inner section of the target is pressed at a temperature of about 230° C. and a pressure of about 550 MPa, giving a density of around 1.9 g/cm³ and the outer section is pressed at a temperature of about 200° C. This target is pressed in air.

The inner section may also be prepared by sintering a mixture of graphite powder and a hydrocarbon bonding material, such as bitumen or tar. The inner section is thus, optionally, prepared according to known manufacturing techniques.

The size and shape of the target can be adjusted according to fit into any filtered cathode arc source, though a typically sized target is circular in cross section having a total diameter (inner and outer sections) of 20 mm–100 mm, preferably 40 mm–80 mm.

In a specific embodiment of the invention the cathode target is prepared from graphite powder having average particle size of about 10 microns (325 mesh), and its inner section has a density of 1.8–1.9 g/cm³.

The invention also provides a method of making a graphite target for use in a cathode arc source, the method comprising pressing graphite powder to form the inner section, in the absence of binding material, at a pressure of 400–620 MPa and a temperature of 130–330° C. and thereafter pressing graphite powder around the inner section at lower temperature or lower pressure to form a solid target.

It is preferred that the graphite powder forming the inner section is pressed at a pressure of 450–620 MPa, more preferably 520–600 MPa. It is further preferred that the pressing temperature is 180–280° C., more preferably 200–260° C.

In use of an embodiment of the invention, the target slides against components of the source or the chamber as it is fed into the chamber using a target feeder of the first aspect of the invention. Accordingly, in a particularly preferred target the outer section of the target is adapted for sliding engagement with electrical contact or contacts in a cathode arc source without damage to the structure of the inner section of the target. The outer section is optionally adapted for sliding engagement with electrical brushes connected to an arc power supply. The outer section is alternatively adapted for sliding engagement with a collar located tightly around the target and in electrical connection with an arc power supply.

The invention also provides apparatus comprising both a target feeder according to the invention and a target cutter according to the invention.

BRIEF DESCRIPTION OF THE DRAWINGS

There now follows description of specific embodiments of the invention, illustrated by drawings in which.

DETAILED DESCRIPTION OF THE PREFERRED EMBODIMENTS

Figure 1:
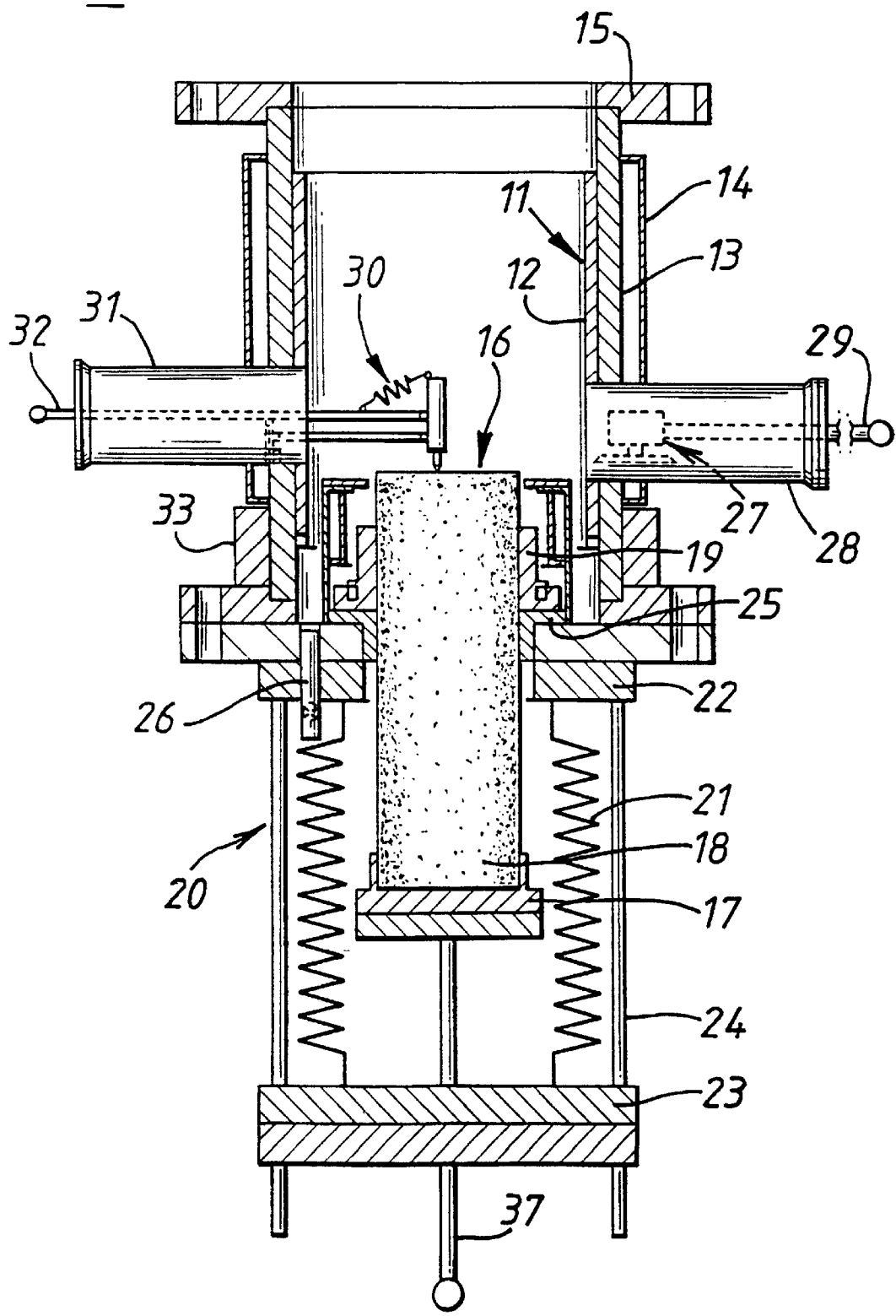
FIG. 1 shows a schematic cross-section of a cathode arc source including a target feeder and a target cutter according to the invention.

Referring to all three figures, a cathode arc source is shown generally as 10 and comprises anode 11 made up of anode liner 12 tightly located against wall 13 of the vacuum chamber of the source. Water for cooling the anode flows through housing 14 in use and flange 15 is for connection for the cathode arc source to a deposition chamber or to macroparticle filtering apparatus, neither of which are shown.

A cathode 16 is composed of a cathode station 17 on which is located cathode target 18. The target 18 is in electrical contact with a conventional arc power supply (not shown) via electrical contacts 19 located around the target.

Target feeder 20 is composed of a vacuum bellows 21 in sealing engagement with a base plate 22 of the source and a bottom plate 23 of the feeder. Bottom plate 23 slides along rods 24 that project from the base 22 of the source. A handle 37 is attached both to cathode station 17 and bottom plate 23 and is for feeding of the target into the chamber by an operator. Alternatively, feeding of the target into the chamber can be achieved using an electric motor, or optionally under control of circuitry associated with the cathode arc source.

The target 18 shown is a solid, graphite target. The apparatus is also suitable for use of a composite target according to the third embodiment of the invention described above.

It is thus seen that by movement of handle 37 the target 18 can be advanced into or retracted from the vacuum chamber of the source 10 without breaking vacuum in the chamber.

Target cutter 27 is located at the side of the wall of the chamber inside housing 28 and can be operated from outside the chamber via handle 29. In use, the target cutter 27 is moved across the target 18 and cuts off an upper portion of the target. Debris is pushed towards exit port 26 for easy removal from the vacuum chamber, usually by operation of a vacuum attached to port 26.

Linear striker 30 is mounted within housing 31 and can be used to strike an arc at the target via operator handle 32.

Figure 2:
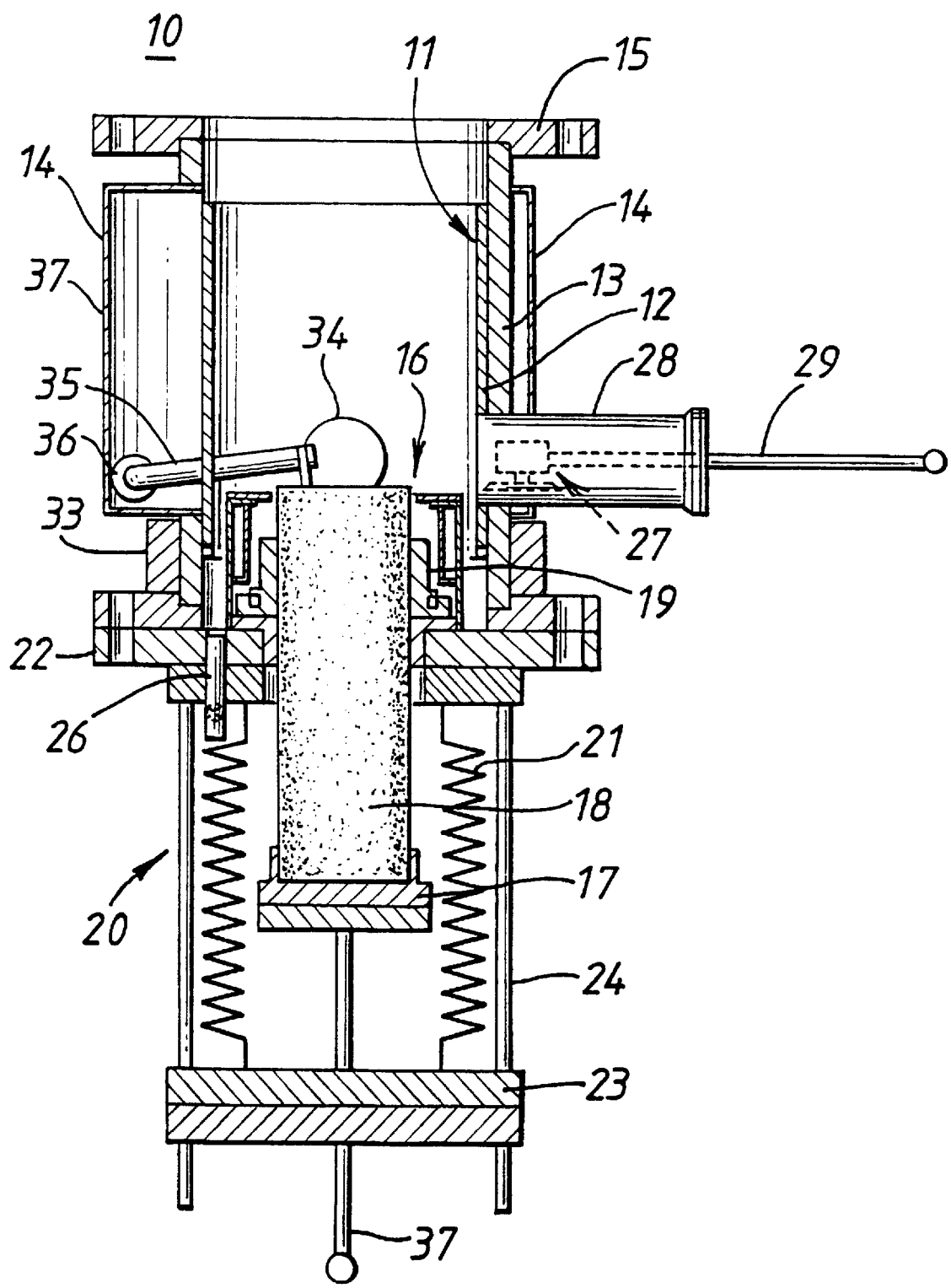
FIG. 2 shows a schematic cross-section of a cathode arc source including a target feeder and a target cutter according to the invention.
Figure 3A:
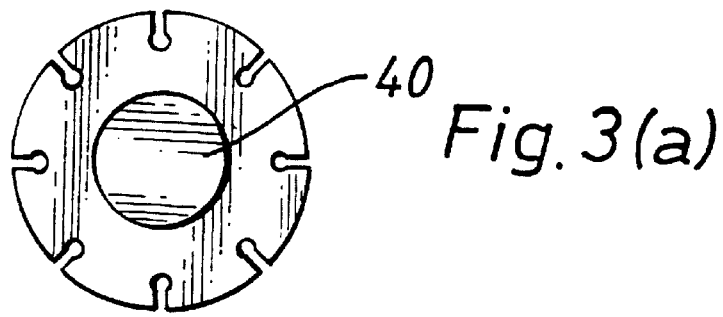
FIGS. 3 (a, b, c and d) shows schematic details of components of target cutters according to the invention.
Figure 3B:
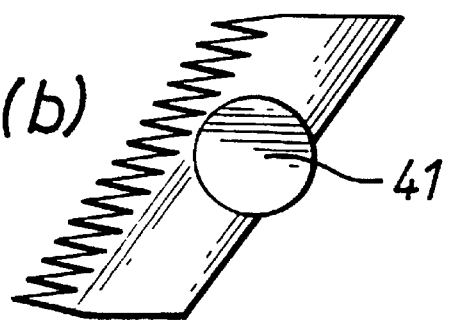
Figure 3C:
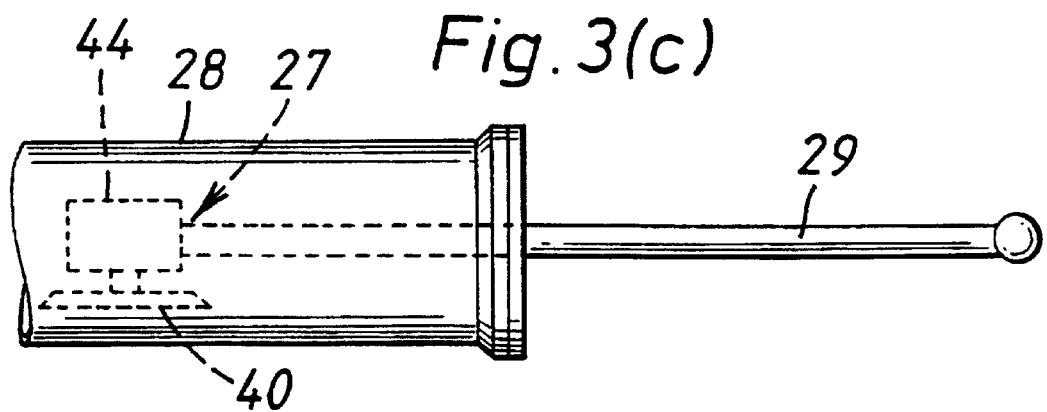
Figure 3D:
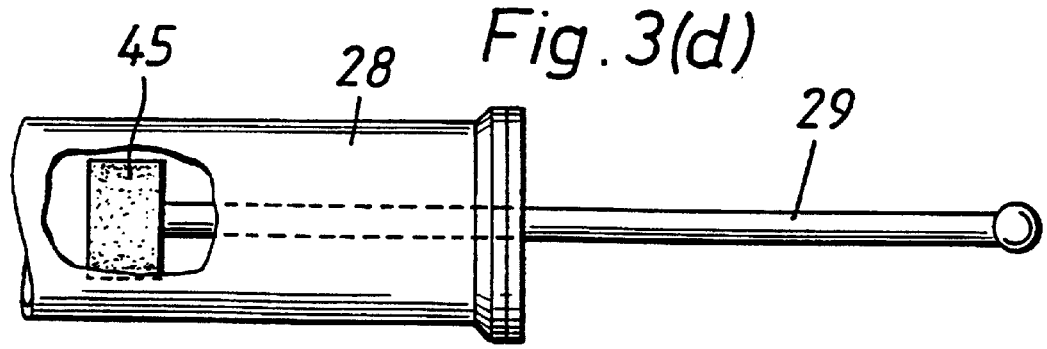

FIG. 2 shows similar apparatus though having a rotary striker 34 mounted on arm 35 and rotatable about mounting 36. The rotary striker 34 is withdrawn into housing 37 after use.

Referring to FIG. 3 in particular, a rotary target cutter blade 40 is shown schematically in 3(a) and is suitable for mounting on target cutter 27 for operation by electric motor 44 as shown in 3(c). Electrical supply to the motor 44 is via a feedthrough (not shown) in the housing 28. A saw tooth cutter 41 is shown in 3(b) and another alternative, a rotary grinding wheel 45, is shown in 3(d).

The invention thus enables prolonged use of a cathode arc source by feeding of a target into the chamber of the source and by optional removal of an upper portion of the target. The invention is suitable for industrial application in cathode arc deposition of coatings on a wide range of substrates.

What is claimed is:

1. An apparatus for feeding a target into a chamber of a cathode arc source, comprising:
    support structure for attachment to or integration with the cathode arc source;
    a cathode station for receiving a target in electrical connection with an arc power supply, where the cathode station is mounted for movement on the support structure;
    means for movement of the cathode station relative to the chamber so as to feed the target into the chamber; and
    means in the chamber for removing an upper portion of the target.

2. The apparatus of claim 1 further comprising means for cutting off an upper portion of the target.

3. The apparatus of claim 2 wherein said cutting means comprises a target cutter mounted on a wall of the source, and adapted to cut off an upper portion of the target and urge that cut upper portion away from the target.

4. The apparatus of claim 3 wherein the target cutter comprises a knife mounted for rotational or sliding movement across the target.

5. The apparatus of claim 4 wherein the target cutter comprises a rotating wheel mounted on support structure adapted to move the rotating wheel across said target.

6. The apparatus of claim 1 wherein the cathode station in use receives a target and advances in a substantially linear path towards the chamber so as to advance the target into the chamber.

7. The apparatus of claim 6 wherein a pinion is mounted on the cathode station and engages with a rack attached to the chamber or attached to the support structure and wherein action of the pinion on the rack moves the cathode station towards or away from the chamber.

8. The apparatus of claim 1 wherein the cathode station has a handle for movement by an external operator.

9. The apparatus of claim 1 wherein movement of the cathode station is achieved via an electric motor, optionally controlled by arc power supply circuitry.

10. The apparatus of claim 1 further comprising a sealing member adapted to provide a seal between the edge of the target and the chamber whilst the target is fed into the chamber.

11. The apparatus of claim 1 adapted for feeding the target into the chamber at a rate of between 0.05 mm per second and 10 mm per second.

12. The apparatus of claim 1 wherein power supply to the target is via one or a plurality of electrical brushes with which the target is in electrical engagement whilst being fed into the chamber.

13. The apparatus of claim 12 wherein a plurality of brushes are evenly spaced around the circumference of the target.

14. The apparatus of claim 1 further comprising a housing surrounding the cathode station and adapted for sealing engagement with the chamber of the cathode arc source.

15. The apparatus of claim 14 wherein the housing is adapted to receive water for cooling of the cathode station or the target or both.

16. The apparatus of claim 14 wherein the housing is adapted to be evacuated.

17. The apparatus of claim 16 wherein the housing comprises a vacuum bellows.

18. The apparatus of claim 14 wherein the housing comprises a feed-through for an electrical supply to the cathode station.

19. The apparatus of claim 14 wherein the housing comprises a feed-through for a handle that enables manual movement of the cathode station by an external operator.

20. A method of depositing a coating of positive ions on a substrate, by deposition of plasma obtained from an arc between an anode and a cathode target in a vacuum chamber, the method comprising:
    striking an arc between the anode and the target,
    feeding the target into the chamber without breaking vacuum in the chamber, and
    removing an upper portion of the target.

21. The method of claim 20 further comprising feeding the target into the chamber and cutting away a portion of the target or portions of the target that project beyond a predetermined level in the chamber.

22. The method of claim 20 further comprising cutting an upper portion of the target using a rotating or slicing cutter mounted on the wall of the chamber and moveable between a position retracted away from the target and a position in which it can cut the target.

23. The method of claim 22 wherein the target cutter is adapted to urge the cut upper portion of the target towards an exit port located towards or at the base of the chamber.

24. The method of claim 20 further comprising striking the arc, stopping the arc, feeding the target into the chamber and thereafter re striking the arc.

25. The method of claim 20 further comprising striking the arc, feeding the target into the chamber and maintaining the arc whilst the target is being fed into the chamber.

26. The method of claim 20 further comprising feeding the target into the chamber at a rate between 0.1 mm per second and 10 mm per second.

27. The method of claim 20 further comprising manually feeding the target into the chamber.

28. The method of claim 20 further comprising controlling the feeding of the target into the chamber by circuitry associated with the cathode arc source.

* * * * *